United States Patent [19]

Bowsky et al.

[11] Patent Number: 4,702,976
[45] Date of Patent: Oct. 27, 1987

[54] HERMETIC TERMINAL ASSEMBLY AND METHOD OF MANUFACTURING SAME

[75] Inventors: Benjamin Bowsky, Maineville; Glenn A. Honkomp, Loveland; Larry G. Burrows, Cincinnati; Edward E. Wilson, Milford, all of Ohio

[73] Assignee: Emerson Electric Co., St. Louis, Mo.

[21] Appl. No.: 909,300

[22] Filed: Sep. 19, 1986

[51] Int. Cl.⁴ ............................................. H01M 2/30
[52] U.S. Cl. .................................... 429/181; 429/185; 174/50.61; 174/152 GM
[58] Field of Search ............... 429/174, 175, 178, 181, 429/180, 185; 174/50.61, 152 GM; 29/630, 837

[56] References Cited

U.S. PATENT DOCUMENTS

| | | | |
|---|---|---|---|
| 4,047,292 | 9/1977 | Shaffer | 429/181 X |
| 4,233,372 | 11/1980 | Bro et al. | 429/174 |
| 4,279,975 | 7/1981 | Bowsky | 429/181 |
| 4,358,514 | 11/1982 | Garoutte et al. | 429/181 |
| 4,486,514 | 12/1984 | Chaney, Jr. | 429/181 X |
| 4,603,095 | 7/1986 | Bowsky | 429/181 |

*Primary Examiner*—Anthony Skapars
*Attorney, Agent, or Firm*—Polster, Polster and Lucchesi

[57] ABSTRACT

An improved terminal pin and end closure structure for an hermetic terminal assembly and method of making the same, the structure including an apertured end closure with a peripheral wall surrounding the aperture to extend at preselected angle from the end closure, the aperture being covered by a sealed terminal pin carrying sealing member which is sealed to the extended peripheral wall.

10 Claims, 15 Drawing Figures

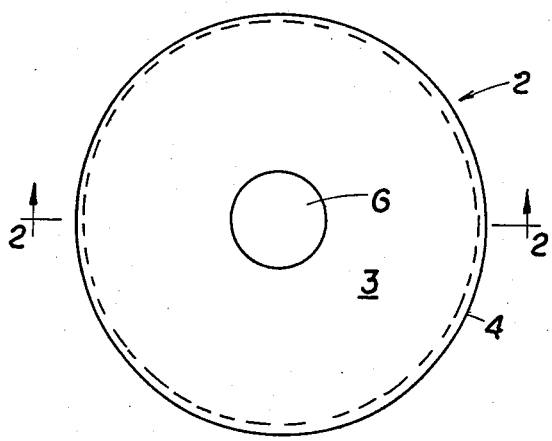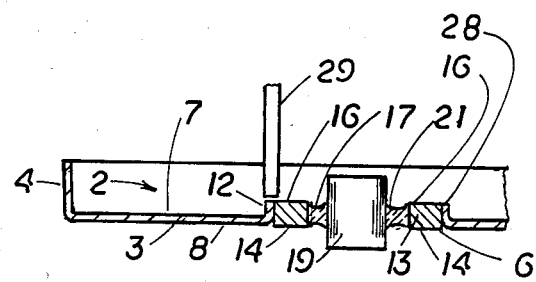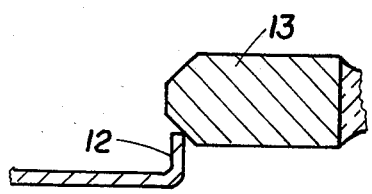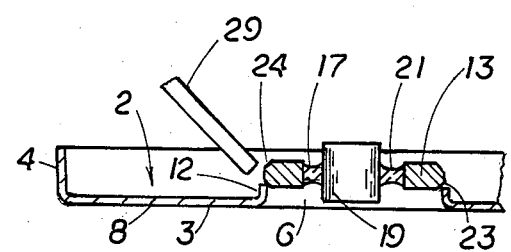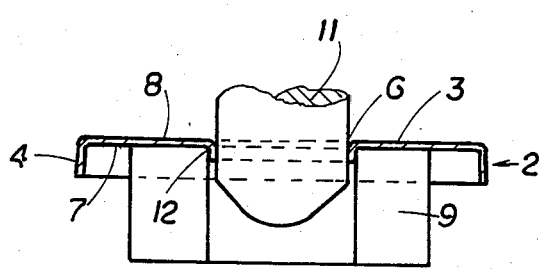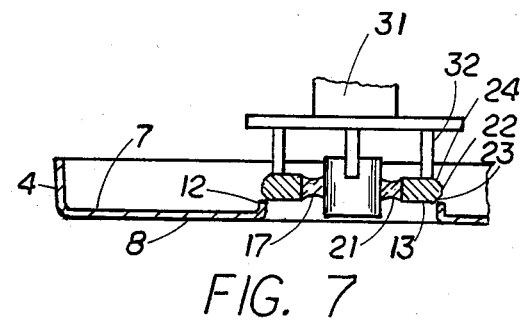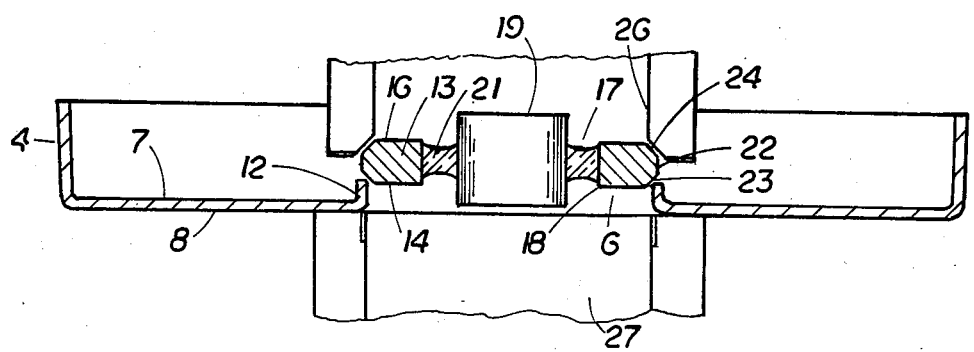

HERMETIC TERMINAL ASSEMBLY AND METHOD OF MANUFACTURING SAME

BACKGROUND OF THE INVENTION

The present invention relates to hermetic terminal assembly structure and a method of making the same and particularly to terminal pin and end closure structure which can be used with hermetic terminal assemblies such as lithium batteries.

It is well known in the art to place an apertured cover in a fixture, the fixture further supporting in the cover aperture a terminal pin surrounded by an annular bead of glass or glass sinter extending from the pin to the aperture wall, the loaded fixture being heated to the melting point of the glass to bond the glass to the cover and to the pin. More recently, to reduce space, time and energy requirements and to avoid cumbersome manufacturing techniques, a universal seal of the eyelet type has been provided in the form of a pin carrying eyelet which can be readily oriented in either of two positions in sealing relation with the aperture of the cover for efficient and economical assembly and welding.

The present invention provides an improved structural assembly and method of manufacturing over more recent techniques gaining the advantages of reducing space, time, material and energy requirements, avoiding cumbersome manufacturing steps and at the same time improving the joining of a pin carrying sealing member, such as an eyelet to the cover, increasing both the strength of the jointure and the structural support and assured positioning of the terminal pin relative the cover to which it is assembled. Further, the present invention allows for the use of thinner covers thus contributing to overall size and weight reduction of the hermetic terminal assembly without sacrificing strength or terminal pin support, providing an assembly structure particularly suited to lithium type batteries. In addition, the present invention provides for the use of various joining techniques all of which can assure both a strong and uniform seal of the sealing member to the cover with an optimum of space, time and energy requirements in a straightforward and economical manner.

Various other features of the present invention will become apparent to one skilled in the art upon reading the disclosure set forth herein.

SUMMARY OF THE INVENTION

More particularly, the present invention provides a terminal pin and end closure structure for an hermetic terminal assembly comprising: an end closure including a main body portion having an aperture therein with an extended peripheral wall portion integral therewith to surround the aperture and extend at a preselected angle to the main body portion for a preselected distance; sealing means geometrically sized to conform with and cover the aperture in cooperative sealed relation with the extended peripheral wall portion, the sealing means having opposed faces with an aperture disposed therethrough through which a terminal pin passes in sealed relation to the aperture. In addition, the present invention provides a novel method of manufacturing an end closure including a terminal pin for an end closure assembly comprising: forming an aperture in an end closure with an integral peripheral surrounding wall portion adjacent the aperture; positioning a sealing means including a terminal pin extending in sealed relationship therethrough so that the sealing means covers the end closure aperture with the peripheral edge face of the sealing means in cooperative abutting realtion to the peripheral surrounding wall portion of the end closure; and, joining the peripheral edge face of the sealing means to the peripheral surrounding wall portion to form a uniform sealed relation therewith.

It is to be understood that various changes can be made by one skilled in the art in the several parts of the structural assembly and in the several steps of the method disclosed herein without departing from the scope or spirit of the present invention.

BRIEF DESCRIPTION OF THE DRAWINGS

Referring to the drawings which disclose several embodiments of the present invention:

FIG. 1 is a plan view of an apertured end closure for a hermetic terminal assembly disclosing the main body portion of the present invention;

FIG. 2 is a cross-sectional view of the end closure of FIG. 1 taken in a plane through line 2—2 of FIG. 1;

FIG. 3 is a view similar to that of FIG. 2, disclosing the forming tool in operative engagement with the aperture in the main body of the end closure to form a protuberance in the form of an extended peripheral wall portion surrounding the aperture;

FIG. 4 is an enlarged cross-sectional schematic view similar to FIG. 3, disclosing a sealing member in the form of a terminal pin carrying eyelet conforming with and covering the aperture with the chamfered edge face of the eyelet abutting anNedge of the extended peripheral wall and electrical resistance welding tools proximate thereto to sealingly join the eyelet to the wall;

FIG. 4a is an enlarged view of a portion of the structure of FIG. 4 disclosing details of the chamfered edge face of the eyelet abutting the extended peripheral wall;

FIG. 5 is a partial cross-sectional view similar to FIG. 4, disclosing laser welding an eyelet without chamfered edge faces with the peripheral face thereof abutting the inner face of the extended wall portion;

FIG. 6 is a partial cross-sectional view similar to FIG. 4, disclosing a laser welding tool proximate the abutting chamfered edge face of the eyelet and the edge of the extended peripheral wall portion to sealingly join the eyelet to the wall;

FIG. 7 is a partial cross-sectional view similar to FIG. 4, disclosing a rotatable inertial welding tool positioned for engagement with an appropriately slotted eyelet, the chamfered edge face of which abuts the edge of the extended peripheral wall portion to be sealingly joined by inertial welding;

FIGS. 8A and 8B through FIGS. 10A and 10B disclose various slotting and gripping arrangements for eyelets for driving connection to an appropriate collet of an inertial welding tool; and, FIG. 11 is a cross-sectional view of an end closure cover and eyelet assembly arrangement similar to that of FIGS. 4, 6 and 7, disclosing an assembly after jointure.

DETAILED DESCRIPTION OF THE INVENTION

Figure 8A:
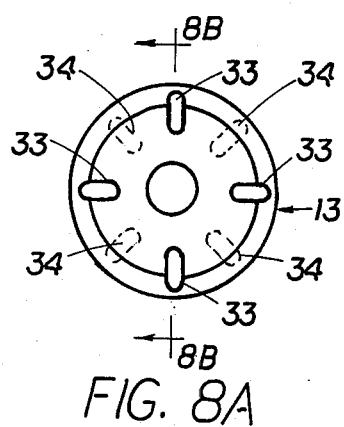

As can be seen in FIGS. 1-4 of the drawings, the novel end closure 2 as disclosed includes a circular main body portion 3 having a peripheral rim 4 extending normally therefrom and a circular opening or aperture 6 centrally disposed therein. It is to be understood that other shapes of end closures, apertures and number of apertures per end closure can be utilized depending upon the shape and construction of the hermetic assembly housing (not disclosed) with which the end closure is associated. In accordance with the present invention, the end closure is formed from a suitable fusible stock material and, when the end closure is to be for lithium type battery assemblies, advantageously is formed from a suitable thin metallic material such as stainless steel strip stock, designated commercially as 304 L SS having a thickness of approximately 0.010±0.001 inches, the main body 3 of the end closure 2 having substantially opposed planar surfaces 7 and 8, one of which serves as an inner surface and the other an outer surface depending upon end closure assembly to the housing.

Referring particularly to FIG. 3 of the drawings, surface 7 of end closure 2 is shown resting on the upper edge face of annular support member 9 with a cylindrical forming tool 11 having displaced the metal of main body portion 3 surrounding aperture 6 and extending through aperture 6 to form an integral protuberance or peripheral wall portion 12 extending normally from surface 8 to surround aperture 6. The distance of extension of peripheral wall portion 12 depends upon the amount of the diameter of aperture 6, it being important that this distance be properly preselected to provide an appropriate amount of metal for the eyelet sealing jointure described hereinafter. It is to be understood that the present invention is not to be considered as limited to the specific method of forming protuberance or peripheral wall 12 as hereinabove described. For example, it would be possible to form peripheral wall 12 by material extrusion or by punching an aperture 6 through main body portion and reducing the arras resulting from the metal displacement by the punching step a preselected amount to provide the desired size peripheral wall 12 surrounding aperture 6.

Referring to FIG. 4, a terminal pin carrying sealing member in the form of an annular eyelet 13 is disclosed. Eyelet 13, like end closure 2, can be formed from a suitable fusible material companionable with the fusible material of end closure 2 and in lithium type battery assemblies advantageously is of the same stainless steel stock as the end closure 2. Eyelet 13 has substantially flat, parallel surfaces 14 and 16, is circular and is sized to conform with and cover aperture 6 in end closure 2. The eyelet 13 has a central aperture 17 defined by an inner cylindrical wall 18 to which a terminal pin 19 is bonded by means of a suitable seal 21, which can be of a preselected glass formulation. The outer margins of the eyelet 13 are defined by an outer wall 22, perpendicular to parallel planar eyelet surfaces 14 and 16 and chamfered perimetric edge faces 23 and 24, extending at mirror-image angles from the opposite perimetric edges of outer wall 22 to eyelet surfaces 14 and 16 respectively. As aforenoted, the angles of the chamfered faces can be identical and the chamfers symmetrical so that the eyelet is symmetrical on either planar surface. In FIG. 4, it is to be noted that chamfered edge face 23 abuts against the inner free edge of peripheral wall 12, it being understood that it would also be possible to have chamfered edge face 24 so abutting the inner free edge of peripheral wall 12, the abutment, in either case, forming a line contact between the chamfered edge face and the peripheral wall edge.

To joiningly seal eyelet 13 positioned to abut peripheral wall 12, any one of several types of joining steps can be utilized. In FIG. 4, charged electrodes 26 and 27 are shown positioned above and below the assembled eyelet and end closure. Parts of the electrodes are suitably anodized to minimize possible arcing between electrodes, the peripheral wall 12 further serving as an electrode spacer to minimize arcing. When a suitable resistance welding current is applied, the wall 12 provides a weld nugget to fuse join the eyelet to the main body portion 3 of end closure 2. Since an ample amount of fusing metal can be provided through an appropriately preselected protuberance or peripheral wall 12, it is possible to make a uniform, securely sealed welded jointure along the entire area even if the main body portion 3 of the end closure 2 should be selectively very thin. The inside peripheral wall 12 serves to provide a high resistance weld area and thus high local current density to allow a quick and thorough weld without damage to seal 21 for eyelet 13.

In forming the seals for eyelets 13, eyelets 13 are positioned in cavities in a fixture with one of either of the flat sides of each eyelet resting on the bottom face of the cavity. An annular glass bead 21 is inserted in eyelet aperture 17 and a terminal pin 19 is inserted in the bead opening to project a preselected distance from surfaces 14 and 16. The loaded fixture is then heated in an oven or furnace to fuse bead 21 to pin 19 an eyelet inner wall 18. When the distance that pin 16 projects from surface 14 and 16 is equal, it makes no difference which face of eyelet 13 abuts the edge of wall 12.

Referring to FIG. 5 of the drawings, it can be seen that in accordance with the present invention, the peripheral wall face of eyelet 13 extending between surfaces 14 and 16 can be flat without chamfering as at 28 and that the distance between surfaces 14 and 16 can equal wall portion 12 so that eyelet 13 has a thickness substantially equal to the extended distance of the inner face of extended wall portion 12 and abuts thereagainst to be sealed thereto by a joining or welding step. In the disclosure of FIG. 5, a suitable laser gun 29 is disclosed schematically, this laser 29 serving to weld fuse the abutting faces of the eyelet 13 and wall 12.

Referring to FIG. 6, a chamfered eyelet 13 is shown with a chamfered edge face 23 abutting the inner free edge of peripheral wall 12 of end closure 2. To join the abutting eyelet and wall, laser gun 29 is disclosed focusing at the line of abutting contact to fuse and securely seal the entire area along the line of abutment.

Referring to FIG. 7, a view similar to that of FIG. 6 is disclosed only in place of laser gun 29, rotatable collet 31 is shown with its drive pins 32 positioned to be engaged in appropriate gripping means in the form of recessed slots in eyelet 13 to rotate the eyelet 13 and thus inertially weld the eyelet 13 to the peripheral wall 12 along the line of abutting contact to fuse and securely seal the entire area along the line of abutment.

Figure 8B:
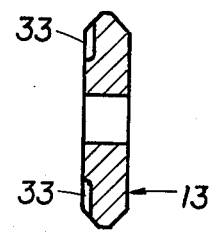

As can be seen in FIGS. 8A and 8B through FIGS. 10A and 10B, various groove type gripping arrangements can be provided in eyelet 13 for drive pins 32. In FIGS. 8A and 8B, four equally spaced slots 33 and 34 are provided on each side of the eyelet 13 with slots 34 being offset 45° from slots 33 in circular formation around the center of the eyelet.

Figure 9A:
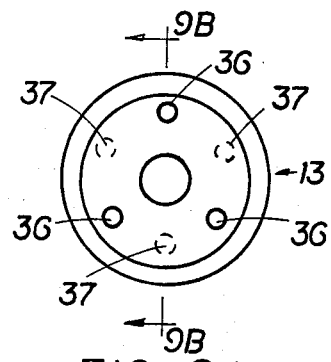
Figure 9B:
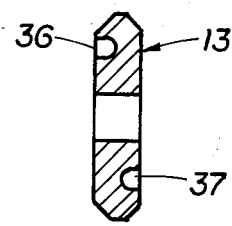

In FIGS. 9A and 9B, the gripping recesses are in the form of three equally spaced dimples 36 and 37 provided on each side of eyelet 13 with dimples 36 being offset 60° from dimples 37 in circular formation around the center of the eyelet.

Figure 10A:
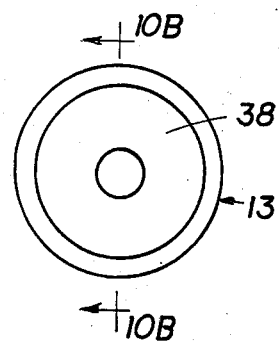
Figure 10B:
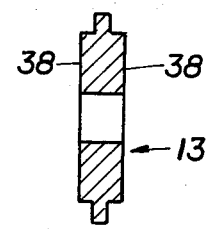

In FIGS. 10A and 10B a stepped grip collar 38 is provided on either side of the eyelet 13 which in turn can be matingly engaged by an appropriately fashioned chuck member (not shown) to be mounted on rotatable collet 31. In this regard, grip collar 38 can be multi-sided if desired to facilitate gripping by an appropriately multi-sided female chuck member mounted on collet 31. From the description above for FIGS. 8A and 8B through FIGS. 10A and 10B, it can be seen that either side of eyelet 13 can be driven by a suitable rotatable collet to permit effcient and uniform inertial welding along the area of contact between eyelet 13 and peripheral wall portion 12. It is to be understood that various other gripping patterns can be employed on the eyelet for collet driving purposes. For example, a foraminous system of meshing merlons and crenals could be employed between either side of the eyelet and collet to insure positive drive without slippage.

Figure 11:
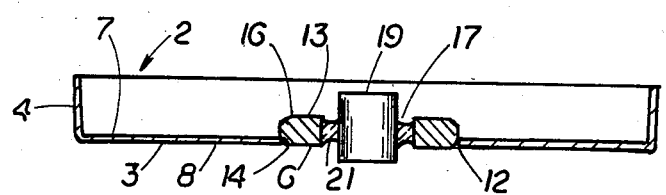

Referring to FIG. 11, an enclosure 2 is disclosed in final form with the eyelet 13 fastened to the closure 2 through wall 12 which has almost been entirely melted to provide a uniform, securely sealed welded jointure along the entire area of contact between wall and eyelet.

From the description set forth above, it is to be understood that although the present invention lends itself to the effective utilization of very thin end closure structure, the size and geometry of the closure is otherwise immaterial as long as the closure aperture and peripheral wall are sized to permit the sealing member such as an eyelet to be securely welded as described. Similarly, the dimensions of the eyelet and terminal pin can be varied, as can the angle of edge face chamfer and the angle of peripheral wall portion 12 to main body portion 3 of end closure 2. As abovenoted, the end closure and eyelet advantageously can be made of compatible stainless steel but other type metals or conceivably even fusible plastics can be employed. Numerous other variations in the construction of the end closure and eyelet structure and in the method of assembly will occur to those skilled in the art in view of the disclosure herein without departing from the scope or spirit of this invention.

The invention claimed is:

1. A terminal pin and end closure structure for an hermetic terminal assembly comprising:
    an end closure including a main body portion having an aperture therein and an extended peripheral wall portion integral therewith to surround said aperture and extend at a preselected angle to said main body portion for a preselected distance with the extremity of said extended peripheral wall portion presenting inner and outer edges;
    sealing means geometrically sized to conform with and totally cover said aperture in said end closure in cooperative overlapping and sealed relation with the entirety of said inner edge of said extended peripheral wall portion, said sealing means having opposed side faces with an aperture disposed therethrough; and
    a terminal pin sealed in said aperture of said sealing means.

2. The terminal pin and end closure structure of claim 1, said peripheral wall portion extending normal to said main body portion.

3. The terminal pin and end closure structure of claim 1, said sealing means being identically symmetrical on said opposed side faces thereof.

4. The terminal pin and end closure structure of claim 1, said terminal pin extending normal to said main body portion of said end closure.

5. The terminal pin and end closure structure of claim 1, said end closure and said sealing means being of fusible material to provide a fused sealed relationship therebetween.

6. The terminal pin and end closure structure of claim 1, said sealing means including an eyelet having a chamfered peripheral edge adjacent at least that side face thereof in sealed relation with said inner edge of said extended wall portion, said chamfered edge abutting and overlapping the entirety of said inner edge of said extended peripheral wall portion.

7. The terminal pin and end closure structure of claim 6, said end closure and said eyelet being of fusible metallic material to provide a fuse welded sealed relationship therebetween.

8. The terminal pin and end closure structure of claim 6, said eyelet having gripping recesses on at least one surface thereof to be drivingly engaged for inertial welding thereof.

9. A terminal pin and end closure structure for an hermetic terminal assembly comprising:
    a fusible metallic end closure including a main body portion having parallel opposed planar surfaces with a circular aperture extending therethrough and an integral peripheral wall portion extending normally from one of said surfaces a preselected distance to surround the periphery of said aperture with the extremity of said extended peripheral wall portion presenting inner and outer edges;
    an annular metallic eyelet portion sized to conform with and totally cover said aperture in said end closure in cooperative overlapping and abutting relation with said inner edge of said extended wall portion, said eyelet being weld fused to the entirety of said inner edge of said extended peripheral wall portion, said eyelet having opposed identical and symmetrical upper and lower planar surfaces with a central aperture therein; and,
    a terminal pin sealed in said eyelet aperture to project perpendicular to the planes of said eyelet and end closure surfaces.

10. The terminal pin and end closure structure of claim 9, said eyelet having chamfered upper and lower perimetric edge faces, said eyelet having a diameter sufficient to permit a chamfered edge face to engage said inner edge of said peripheral wall portion to be weld fused thereto.

* * * * *